United States Patent
Church et al.

(10) Patent No.: US 9,689,911 B2
(45) Date of Patent: Jun. 27, 2017

(54) SYSTEM AND METHOD EMPLOYING JOINT BYPASS CIRCUIT TO TEST INSULATED JOINTS IN TRACK SYSTEMS

(71) Applicant: ALSTOM TRANSPORT TECHNOLOGIES, Levallois Perret (FR)

(72) Inventors: Benjamin Church, Grain Valley, MO (US); Barton Wyatt, Grain Valley, MO (US); Darren Melton, Grain Valley, MO (US)

(73) Assignee: ALSTOM TRANSPORT TECHNOLOGIES, Levallois Perret (FR)

( * ) Notice: Subject to any disclaimer, the term of this patent is extended or adjusted under 35 U.S.C. 154(b) by 106 days.

(21) Appl. No.: 14/631,907

(22) Filed: Feb. 26, 2015

(65) Prior Publication Data

US 2016/0252563 A1    Sep. 1, 2016

(51) Int. Cl.
| | |
|---|---|
| *G01R 31/12* | (2006.01) |
| *G01R 31/14* | (2006.01) |
| *B61L 23/00* | (2006.01) |
| *B61L 1/18* | (2006.01) |
| *B61L 1/20* | (2006.01) |
| *B61L 27/00* | (2006.01) |

(52) U.S. Cl.
CPC .......... *G01R 31/1227* (2013.01); *B61L 1/188* (2013.01); *B61L 1/20* (2013.01); *B61L 23/00* (2013.01); *B61L 27/0088* (2013.01); *G01R 31/14* (2013.01)

(58) Field of Classification Search
CPC ..... G01R 31/1227; G01R 31/14; E01B 11/54; B61L 13/04; B61L 23/00; B61L 1/188; B61L 27/0088; B61L 1/20
USPC .......................................................... 324/551
See application file for complete search history.

(56) References Cited

U.S. PATENT DOCUMENTS

| | | | | |
|---|---|---|---|---|
| 2,518,087 A | * | 8/1950 | Sorensen | G01R 31/1245 324/217 |
| 4,320,881 A | * | 3/1982 | Campbell | B61L 21/06 246/121 |
| 4,619,425 A | * | 10/1986 | Nagel | B61L 21/06 246/167 R |
| 5,145,131 A | * | 9/1992 | Franke | B61L 1/188 246/122 R |
| 5,330,135 A | * | 7/1994 | Roberts | B61L 23/166 246/122 R |

(Continued)

OTHER PUBLICATIONS

Peltier et al., Measuring degradation of bonded insulated rail joints, paper, 2007, pp. 1-32, Newmark Civil Engineering Lab, University of Illinois at Urbana-Champaign, Urbana, IL U.S.

*Primary Examiner* — Billy Lactaoen
(74) *Attorney, Agent, or Firm* — Hahn Loeser & Parks, LLP (57) ABSTRACT

A system includes a signal system controller electrically connected to a first track section of a first rail of a track system, and electrically connected to a second track section of the first rail, in which the first track section is separated from the second track section by a first rail insulated joint. The signal system controller is configured to transmit a test signal on the first track section and configured to receive the test signal on the second track section to test the first rail insulated joint between the first track section and the second track section.

13 Claims, 3 Drawing Sheets (56) References Cited

U.S. PATENT DOCUMENTS 5,465,926 A * 11/1995 Brown .................. B61L 23/168
246/122 R

* cited by examiner

SYSTEM AND METHOD EMPLOYING JOINT BYPASS CIRCUIT TO TEST INSULATED JOINTS IN TRACK SYSTEMS

TECHNICAL FIELD

Embodiments of the subject matter disclosed herein relate to systems and methods for testing insulated joints in track systems.

DISCUSSION OF ART

Track circuits for railroad signals and crossings may be tested to ensure proper operation. Components that require periodic testing include the insulated joints disposed between certain adjacent sections of rail tracks, which electrically separate the track sections to define discrete track circuits. The prior systems and methods for testing these insulated joints have required significant manual effort, resulting in increased costs.

BRIEF DESCRIPTION

Presently disclosed is a system and method for testing insulated joints in a track system. In an embodiment, the system includes a signal system controller electrically connected to a first track section of a first rail of a track system, and electrically connected to a second track section of the first rail, wherein the first track section is separated from the second track section by a first rail insulated joint. The signal system controller is configured to transmit a test signal on the first track section and is configured to receive the test signal on the second track section to test the first rail insulated joint between the first track section and the second track section.

In some embodiments, the signal system controller further includes a first joint test circuit having a first test signal transmitter and a first test signal receiver connected in series across the first rail insulated joint. In some embodiments, the signal system controller is further electrically connected to a third track section of a second rail of the track system, and electrically connected to a fourth track section of the second rail, wherein the third track section is separated from the fourth track section by a second insulated joint. The signal system controller is configured to transmit the test signal on the third track section and configured to receive the test signal on the fourth track section to test the second rail insulated joint between the third track section and fourth track section.

In some embodiments, the signal system controller further includes a second joint test circuit having a second test signal transmitter and a second test signal receiver connected in series across the second rail insulated joint.

In some embodiments, the signal system controller further includes a first insulated joint bypass circuit configured to selectively connect a first transmitter to a second receiver bypassing the first insulated joint, in some embodiments, the signal system controller further includes a second insulated joint bypass configured to selectively connect a second transmitter to a first receiver bypassing the second insulated joint.

In some embodiments, the system also includes a test controller configured to operate the signal system controller to test the first insulated joint in response to instructions received from an operator. In some embodiments, the signal system controller is configured to automatically transmit the test signal during a time period the signal system controller is not transmitting a control signal on the first track section. In some embodiments, the test signal is a control signal used to communicate from the signal system controller to another signal system in the track system.

In some embodiments, the signal system controller is configured to add the test signal to a control signal used to communicate from the signal system controller to another signal system in the track system.

In some embodiments, the system also includes a communications interface operable to receive instructions from a remote operator and to control the signal system controller to test the first insulated joint in response to the instructions that are received.

In some embodiments, the signal system controller is further configured to determine an electrical resistance of the first insulated joint. In some embodiments, the signal system controller is further configured to determine a leakage current through the first insulated joint. In some embodiments, the test signal is an AC or DC voltage signal.

Also disclosed is a method of testing insulated joints in a track system. In an embodiment, the method includes, at a controllable signal system controller, automatically determining the integrity of a first insulated joint by comparing a transmitted signal transmitted by the signal system controller on a first track section of a rail of a track system with a received signal received by the signal system controller from a second track section of the rail of the track system. The second track section is separated from the first track section by the first insulated joint.

In some embodiments, the transmitted signal is the control signal used to communicate from the signal system controller to another signal system controller electrically connected to the rail. In some embodiments, the method also includes determining the integrity of the first insulated joint in real-time by comparing the control signal transmitted with the received signal during each transmission of the control signal.

In some embodiments, the transmitted signal is a test signal. In some embodiments, the method also includes applying the test signal to the first track section with the signal system controller during a time period when the signal system controller is not applying a control signal to the first track section. In some embodiments, the method also includes applying the test signal to the first track section with the signal system controller during a time period when the signal system controller is also applying a control signal to the first track section.

In some embodiments, determining the integrity of the insulated joint includes measuring a leakage current through the first insulated joint. In some embodiments, determining the integrity of the insulated joint includes alternatively or additionally calculating the electrical resistance of the first insulated joint. In some embodiments, determining the integrity of the first insulated joint includes identifying a rate of change of a leakage current through the first insulated joint as being greater than or equal to a predetermined threshold.

In some embodiments, the method also includes automatically establishing an electrical bypass around the first insulated joint to test a second insulated joint between a third track section and a fourth track section to which the signal system controller is connected. In some embodiments, the method also includes automatically establishing an electrical bypass around a second insulated joint between a third track section and a fourth track section to which the signal system controller is connected to test the first insulated joint.

In some embodiments, the method also includes communicating a maintenance request to a remote operator in response to determining the integrity of the first insulated joint.

In some embodiments, the method also includes receiving an instruction at the controllable signal system controller from a remote operator to test the first insulated joint, and automatically determining the integrity of the first insulated joint in response to the received instruction.

In some embodiments, the method also includes automatically determining the integrity of the first insulated joint in response to a predetermined monitoring schedule.

In some embodiments, the method also includes automatically monitoring local environmental conditions, and automatically determining the integrity of the first insulated joint in response to a change in the monitored conditions.

Also disclosed is a test module (e.g., insulated joint test module) configured to be connected to a signal system controller. In an embodiment, the test module includes a controllable test circuit having a test signal transmitter and a test signal receiver. The insulated joint test module is configured to connect to a signal system controller such that the controllable test circuit spans an insulated joint. The test signal transmitter is configured to apply a test signal across the insulated joint responsive to an input from a controller (e.g., the signal system controller or another controller), and the test signal receiver is configured to measure a leakage current through the insulated joint. In embodiments, the insulated joint test module is further configured to generate an output signal responsive to the measured leakage current to test the insulated joint. In some embodiments, the output signal corresponds to a health status of the insulated joint. In some embodiments, the insulated joint test module is further configured to communicate the output signal to the controller. In some embodiments, the controllable test circuit further includes a switch controllable in response to the input from the controller, and the switch is configured to selectively close the test circuit spanning the insulated joint to enable testing of the insulated joint.

BRIEF DESCRIPTION OF THE DRAWINGS

Reference is made to the accompanying drawings in which particular embodiments and further benefits of the invention are illustrated as described in more detail in the description below, in which.

DETAILED DESCRIPTION

Embodiments of the subject matter disclosed herein relate to systems and methods for testing insulated joints between sections of track, such as in a railroad track systems. The disclosed subject matter further relates to systems and methods for selectively applying a voltage across an insulated joint and measuring leakage current to test the integrity of the insulated joint. The insulated joint test system may be controlled from a remote location enabling testing of the insulated joint without a local operator present, allowing for improvements in the insulated joint testing process.

A track system, such as a railroad system, includes electrically isolated track sections separated by insulated joints. The use of insulated joints is well known and such joints may be used to define sections of track around certain locations, such as crossings or intersections. These track systems also include signal system controllers for controlling the operation of signals, such as may be used at railroad crossings. The signal system controllers communicate along a section of track from a signal system controller at one end of the track section transmitting a control signal to a signal system controller at the other end of the track section that receives the control signal. The signal system controllers form a circuit on each rail of the track, and may communicate in opposite directions on each rail or each section of the track system. As disclosed herein, the signal system controllers synchronize communications along the rails in a track system. For example, a first signal system controller may transmit a control signal, such as a DC-coded pulse frame, on a track section, while a second controller connected to the same track section receives the control signal. In an embodiment, the control signal is transmitted in a frame that repeats every 2.8 second with first signal system controller transmitting in the first half of each frame. For communications in the opposite direction, the second signal system controller may transmit on the track section during the second half of the 2.8 second frame (i.e., offset by 1.4 seconds from the transmission of the first signal system controller), such that adjacent controllers will not interfere with each other. In this manner, the signal system controllers are capable of synchronizing communications in along the rails of the track system.

Signal system controllers are often used in railroads having multiple track sections, each separated by an insulated joint. The insulated joints isolate each section of rail thereby forming discrete circuits which may be used by the signal system controllers. If the insulated joint between adjacent rail sections fails, the signal transmitted on one rail section may be transmitted to the next rail section in an undesired manner. The insulated joints may wear out over time, and the performance of the insulated joints could be adversely affected by environmental conditions. When insulated joints fail, railroads are impacted by costly delays.

To ensure that the insulated joints operate properly, testing may be required by the track owner and/or government authorities. For example, regulations may require that all insulated joints be inspected at least once every three months. In the past, manual testing has been performed by dispatching an operator to the track system. The operator then places a test system across the insulated joint to ensure an open circuit is maintained. As the insulated joint degrades, the test system may detect leakage current through the insulated joint and assess the degree to which the insulated joint has degraded. When an insulated joint is identified as being no longer sufficient to maintain the required electrical isolation between the adjacent rail sections, the insulated joint must be repaired or replaced. Until repairs or replacement are completed it could be necessary to discontinue use of that section of the track system, resulting in schedule disruptions and significant costs due to unplanned downtime. In addition, physically placing a testing system across each of the insulated joints in a track system (possibly in remote locations) requires significant time and labor, leading to substantial costs.

In various embodiments, a system and method are disclosed for testing insulated joints. In an embodiment, a system includes a signal system controller electrically connected to a first track section of a first rail of a track system, and electrically connected to a second track section of the first rail. The first track section is separated from the second track section by an insulated joint. The signal system controller is configured to transmit a test signal on the first track section and configured to receive the test signal on the second track section to test the insulated joint disposed between the adjacent track sections. In embodiments, the test signal is an AC or DC voltage signal used specifically for testing the insulated joint. In other embodiments, the test signal is at least a portion of the control signal used for synchronizing communications along the rail that may also be used for testing the insulated joint. In yet other embodiments, the test signal is added to the control signal without interfering with the function of the control signal. In embodiments, the signal system controller is configured to automatically transmit the test signal during a time period when the signal system controller is not transmitting a control signal on the first track section. In other embodiments, the signal system controller is configured to automatically transmit the test signal during a time period when the signal system controller is transmitting the control signal on the first track section.

Embodiments of the disclosed system are capable of testing the insulated joint in a variety of ways. For example, the signal system controller may be configured to determine a leakage current through the insulated joint by selectively applying a voltage across the insulated joint and measuring the current flow through the insulated joint. In a similar manner, the electrical resistance of the insulated joint may be determined and used to assess the integrity of the insulated joint. In other embodiments, the integrity of the insulated joint is characterized by identifying a trend or change over time. In one embodiment, the integrity of the insulated joint is determined by identifying a rate of change of a leakage current through the first insulated joint. The rate of change of the leakage current may also be compared to a predetermined threshold. For example, if the leakage current is identified as increasing over a time period of days or weeks, a maintenance alert or request may be generated so that preventative maintenance may be schedule prior to a failure of the insulated joint.

Embodiments of the disclosed system also enable testing of the insulated joint by remote operation, without requiring personnel to be physically present at the location of the insulated joint to be tested. In this manner, significant costs savings may be achieved. In addition, automated and real-time methods of testing and monitoring insulated joints are enabled that were not possible with previous systems.

In embodiments, elements of the system may be housed in a signal room or other wayside equipment housing located in proximity to a section of a track. For purposes of illustration and explanation, components of the system will be described as discrete elements. However, the functions of the selected components may be implemented in one or more devices and may be combined or separated as desired in a given installation.

In an installation, a track system may include two rails each comprised of multiple rail sections separated by insulated joints. The signal system controller is electrically connected to each rail of the track system on opposite sides of the insulated joints. A signal system controller includes a transmitter and receiver for communicating on the rail sections on one side of the insulated joint, and a corresponding transmitter and receiver for communicating on the rail sections on the other side of the insulated joint. In this manner, the signal system controller is able to communicate along the rails to other signal system controllers connected to the rails at the opposite ends of the rail sections. By positioning signal system controllers at each insulated joint, communication is enabled from one controller to the next along the length of the of the track system.

In an embodiment, the signal system controller includes a test circuit connected in series across the insulated joint. The test circuit includes a test signal transmitter and a test signal receiver connected in series with the insulated joint. In operation, the test circuit may be selectively isolated from the transmitters and receivers used to communicate control signals along the rails so that a test signal is applied to the insulated joint. In one embodiment, the test signal transmitter is an AC or DC voltage source, and the test receiver is a current meter configured to measure current flow through the test circuit. By applying the test signal to the insulated joint, the integrity of the joint may be determined by measuring a leakage current through the insulated joint.

In another embodiment, the signal system controller includes a first transmitter and receiver for communicating on one side of an insulated joint, and a second transmitter and receiver for communicating on the other side of the insulated joint. The signal system controller also includes at least one bypass circuit configured to selectively connect the first transmitter to the second receiver by bypassing the first insulated joint, which allows for testing of the second insulated joint. The signal system controller may also include a second bypass circuit configured to selectively connect the second transmitter to the first receiver bypassing the second insulated joint, which allows for testing of the first insulated joint. In this manner, the same transmitters and receiver used for synchronizing communications along the rails are used for testing the insulated joints.

The disclosed system may be controlled to selectively (i.e., controllably) test the insulated joints in response to instructions as described further below. In some embodiments, the system includes one or more relays to connect or disconnect the test circuit across the insulated joint. In other embodiments, one or more relays may be utilized to connect or disconnect the bypass circuit for testing the insulated joint. In each case, the relays may be vital relays so that in the event of a failure the relay maintains an open circuit to avoid interfering with normal operation of the signal system controller. In other embodiments, the system may include one or more fixed or variable impedance resistors to facilitate testing the insulated joint under various voltage conditions. During a given test, the resistance (impedance) of the insulated joint may be determined and compared against one or more thresholds to characterize the health of the insulated joint as "functioning properly", "degraded but still functional", or "failed" and no longer usable. The resistance of the insulated joint may be characterized as the resistance measured when a voltage is applied to the insulated joint by the signal system controller with appropriate correction for other circuit elements. In other embodiments, the system may measure leakage current and characterize the integrity of the insulated joint based on the leakage current with or without computing the resistance of the insulated joint. In yet other embodiments, a trend in the measured electrical resistance or leakage current may be used to characterize the health of the insulated joint.

In some embodiments, a test circuit of the signal system controller may be positioned near the insulated joint, while being controllable from a controller located in a signal room.

By locating the test circuit closer to the insulated joint, the length of connecting wires may be reduced allowing for better control of the voltage applied to the insulated joint and a more accurate measurement of leakage current and/or resistance. In other embodiments, the test circuit may be located within the signal room (or other wayside equipment housing).

A test circuit of the signal system controller may be electrically connected to the rail of the track system on opposite sides of an insulated joint in a variety of configurations. In some embodiments, the test circuit is directly connected to the rail through appropriate wires or other conductors. By connecting the test circuit directly to the rails, the length of the connections may be reduced improving the accuracy of the system. In other embodiments, the test circuit is electrically connected to the rails through the existing connections of the signal system controller, such that the attachment to the rails is shared for both testing the insulated joint and communicating along the rails.

In embodiments, the system further includes a test controller and a communications interface. The test controller may be in communication with the signal system controller in order to direct operation of each component of the system to conduct a test of an insulated joint. The test controller may be locally operable allowing onsite personnel to operate the system to test the insulated joint. In addition, the controller may receive instructions from a remote operator through the communications interface. In embodiments, the communications interface provides two-way communication with a remote operator, which may be an automated system. The communications interface may communicate over a wired or wireless connection, including a telephone network, cellular network, or wireless network.

In an embodiment, the test controller is configured to operate the signal system controller to automatically apply a test signal across the insulated joint and measure the leakage current through the insulated joint in response to instructions received from an operator. The test controller may compare a signal transmitted on a first track section on one side of an insulated joint, with a signal received from a second track section on the opposite side of the insulated joint. The integrity of the insulated joint may then be determined by comparing the transmitted and received signals, for example to compute a leakage current, a resistance, or other parameters correlated with the integrity of the insulated joint. In yet another embodiment, the test controller may be configured to adjust the signal system controller to apply a different test signal in order to further assess the integrity of the insulated joint under various conditions. The controller is further operable to receive information on the status of the signal system controller, including the state of each insulated joint tested by the system.

In another embodiment, the communications interface is operable to receive instructions from a remote operator, where the instructions control the signal system controller in order to test an insulated joint. In this manner, the signal system controller may be controlled and the insulated joints tested without requiring on-site personnel. In embodiments, the communications interface also communicates the status of the insulated joints to the remote operator. The status may include an indication of the health of the insulated joint. The status may also include other parameters of the signal system controller which are detectable by the test controller, such as a diagnostic signal or any fault indications. In yet further embodiments, communications interface is operable to receive instructions to calibrate the signal system controller to improve the performance of the system. Calibration may be required as a result of changes in the circuit, or changes in external conditions. Examples of external conditions include environmental conditions, such as temperature or precipitation, which may alter the impedance of the rails or wires connecting the rails to the signal room. In some embodiments, the system may automatically monitor local environmental conditions, and automatically determine the integrity of an insulated joint in response to a change in the monitored conditions. In this manner, the insulated joint could be tested under various conditions which could affect the integrity of the joint providing additional insight regarding the health of the joint, and potential for future maintenance.

In some embodiments, the remote operator is an automated track testing system. In embodiments, an automated track testing system includes instructions to implement methods for testing and/or calibrating the track circuit, including the insulated joint. Embodiments of the track testing system are also contemplated in which the methods may be performed in a semi-automated fashion with some or all steps being manually controlled by an operator.

In one embodiment, the track testing system issues an instruction to test an insulated joint of the track system. The instruction is received at a controllable signal system controller, either directly or through one or more of a communications interface and test controller. In an embodiment, the signal system controller selectively connects a test circuit to apply a test signal across and measure current through the insulated joint in response to the instruction that is received. In another embodiment, the signal system controller selectively engages a bypass circuit to bypass one of the insulated joints so that a test signal may be applied to the insulated joint on the opposite rail. Once the electrical connection is established by the controllable signal system controller, the test signal is applied across the insulated joint and the integrity of the insulated joint is determined. Once the insulated joint test is complete, the signal system controller is instructed to disconnect the test circuit or bypass circuit, returning the signal system controller to its normal operating state. In some embodiments, the time required to connect the circuits, test the insulated joint, and disconnect the circuits may be sufficiently limited that related systems are unaffected. In other embodiments, related systems such as communications along the rails may be temporarily suspended during a test of an insulated joint. In yet another embodiment, a test of the insulated joint may be completed during a portion of the frame when no communication is occurring on a given rail. If the signal system controller is unable to test the insulated joint or the test reveals a failed or degraded insulated joint, the system may register a fault allowing appropriate actions to be taken, which may include scheduling maintenance or in some instances closing the track section until further testing and repairs are completed.

In yet another embodiment, the track testing system is configured to automatically generate instructions to test an insulated joint in response to a predetermined monitoring schedule. Due to the remote operation capability and the ease of use of the presently disclosed system, the schedule for monitoring insulated joints may be significantly increased with minimal cost, allowing for more frequent testing and early identification of changes or deterioration in the insulated joints. In another embodiment, the track testing system automatically monitors local environmental conditions, such as temperature and humidity. The track monitoring system may automatically generate instructions, either locally or from a remote operator, to test an insulated joint in response to a detected change in the monitored environmental conditions. In still yet other embodiments, the track testing system may automatically generate instructions to test an insulated joint in response to operational information relating to the track system, such as the number of trains to have passed, the time since the last train occupied the track, or in advance of a scheduled arrival of a train based on an accessible track schedule.

In yet other embodiments, the integrity of the insulated joint may be tested simultaneously with the communication occurring on a given rail without a specific instruction or control system operation. For example, the integrity of an insulated joint may be determined by comparing the control signal transmitted on one track section, with a signal received on an adjacent track section separated by an insulated joint. A leakage of the control signal identified in the signal received from the adjacent track section would indicate that the insulated joint is not maintaining electrical isolation between the track sections, Such simultaneous testing may be conducted periodically or continuously greatly increasing the ability to monitor changes in the integrity of the insulated joint in real-time. In this manner, a degradation of the insulated joint may be identified and reported in real-time, further reducing the risk of unplanned joint failure and the associated costs. By testing more frequently and under a variety of conditions, early indications of insulated joint failures may be identified and preventative maintenance scheduled to reduce the impact on railroad operations.

Figure 1:
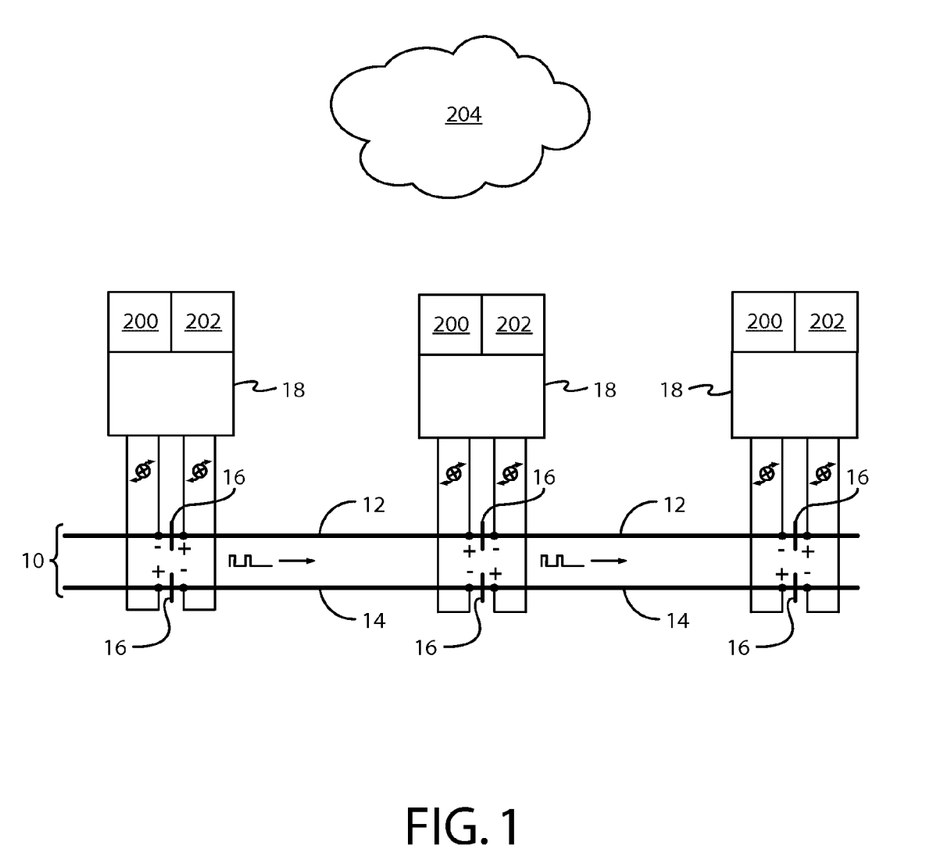
FIG. 1 is a schematic view of a track system with multiple signal system controllers.

Referring now to FIGS. 1-5, specific embodiments of the disclosed system are illustrated. As shown in FIG. 1, a track system 10 includes a first rail 12 and a second rail 14. The track system 10 is divided into electrically isolated track sections separated by insulated joints 16. The track system 10 also includes a plurality of signal system controllers 18 located along the length of the track system. Each signal system controller 18 is connected to both the first rail 12 and the second rail 14 of the track system on either side of the insulating joints 16, enabling the signal system controller to communicate with the signal system controllers at opposite ends of the track sections to which it is connected. By way of illustration, the signal system controllers 18 shown in FIG. 1 are configured to enable bi-directional transmission throughout the track system. Referring FIG. 1, the left signal system controller 18 has a "positive" connection to the first rail 12. The left signal system controller is thus illustrated as transmitting to the right on the first rail 12 to the middle signal controller. In a similar manner, the middle signal system controller 18 also has a "positive" connection to the first rail 12. The middle signal system control is thus configured to transmit to the left on the first rail to the left signal system controller. Bi-directional communication between the left signal system controller and middle signal system controller is thus enabled. In this illustration, a return current would flow on the second rail 14 in this track section as illustrated by the negative connections. In a similar manner, bi-directional communication is provided between the middle signal system controller and right signal system controller. The middle signal system controller and right signal system controller each have a "positive" connection to the second rail 14, and the return current would flow on the first rail 12 in this track section. The plurality of signal system controllers 18 are thus configured to synchronize communications along the track system in either direction.

In an embodiment, the signal system controllers transmit DC coded pulse frames to communicate along the track system. The DC coded pulse frames repeat every 2.8 seconds with the coded pulses residing in one half of the pulse frame. In addition, the transmissions in opposite directions are offset by 1.4 seconds (i.e. one half of a frame length) so that communications in opposite directions do not overlap. As a result, adjacent signal system controllers will not interfere with each other and the signal system controllers are able to synchronize communications in both directions along the length of the track system.

Figure 2:
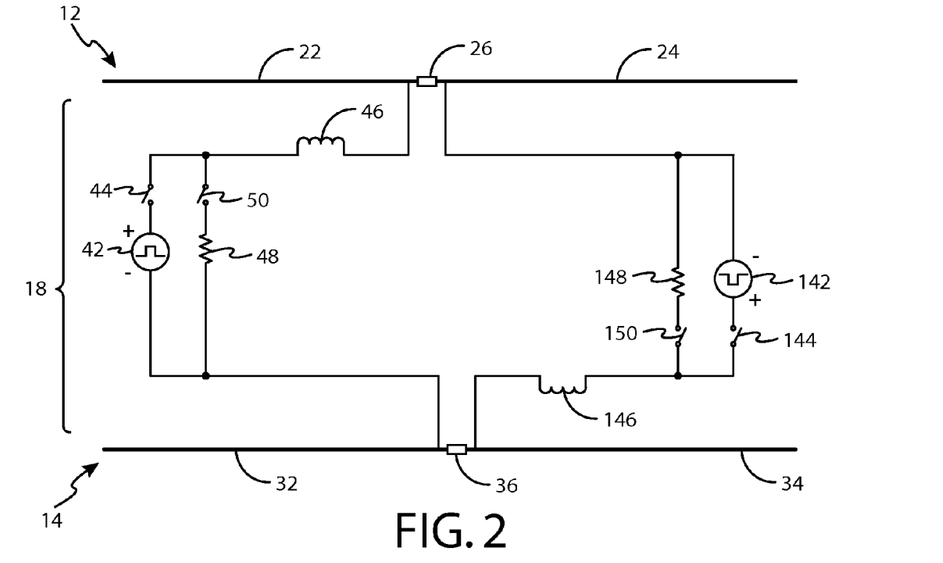
FIG. 2 is a schematic view of a signal system controller at an insulated joint.

Referring now to FIG. 2, one example of a signal system controller is illustrated. The first rail 12 includes a first section 22 and second section 24, separated by an insulated joint 26. The second rail 14 includes a third section 32 and a fourth section 34, separated by a second rail insulating joint 36. The signal system controller is connected to each of the track sections 22, 24, 32, 34 for transmitting and receiving along the rails. In this embodiment, the signal system controller 18 includes a track code generator 42 configured to transmit on section 22 of the first rail 12 through track choke 46 when the transmit switch 44 is closed. The signal system controller 18 includes a receive sense resistor 48 configured to receive signals from a track section 32 of the second rail 14 when the receive switch 50 is closed. In the same manner, the signal system controller is further configured to transmit on section 34 of the second rail 14 with the track code generator 142 through the transmit switch 144 and track choke 146, and to receive from the section 24 of the first rail 12 with the receive sense resistor 148 and receive switch 150. So that the signal system controller may receive from one track section while transmitting on another, the insulating joints 26, 36 maintain electrical separation between the track sections 22, 24 of the first rail 12, and the track sections 32, 34 of the second rail 14.

In one embodiment, a method is disclosed that includes transmitting on track section 22 with track code generator 42 and simultaneously receiving on track section 24 with receive sense resistor 150. The method further includes automatically determining the integrity of the insulated joints 26, 36 by determining the leakage current through the insulated joints 26, 36 based on a comparison of the received signal with the transmitted signal. Alternatively, track code generator 142 may be used to transmit on track section 34 and receive sense resistor 48 used to receive on track section 32 to test the integrity of the insulated joints 26, 36. In this embodiment, the measured leakage current represents leakage current through both of the insulated joints 26, 36 thereby identifying the failure or degradation of both insulated joints. In some embodiments, testing of the insulated joints is done with the control signals and the system is further configured to distinguish between a leakage current signal and an expected control signal properly received from an adjacent signal system controller. In one embodiment, the leakage current and the expected control signal flow in opposite directions allowing for discrimination of the two signals for testing the insulated joint.

Figure 3:
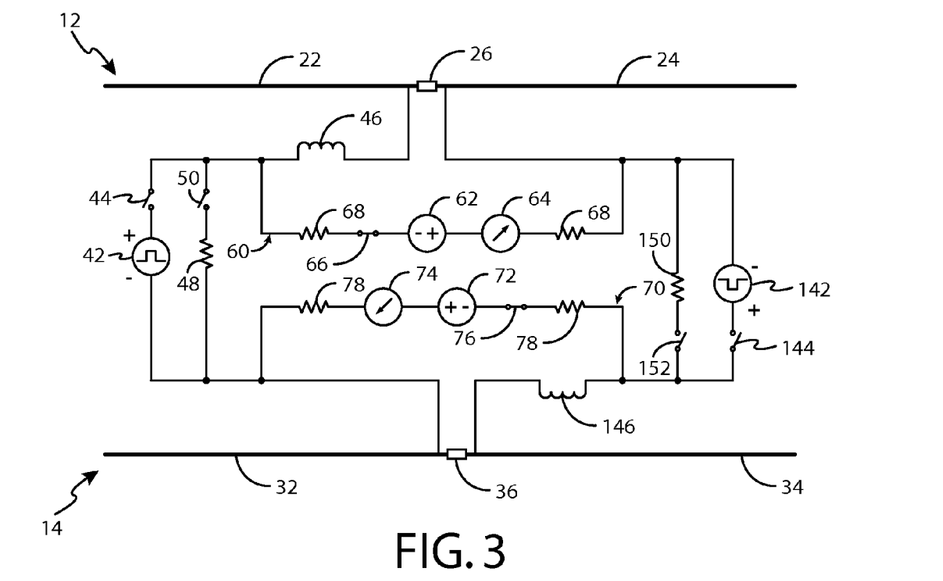
FIG. 3 is a schematic view of another embodiment of a signal system controller.

Referring now to FIG. 3, another embodiment of the system for testing insulated joints is disclosed. The first rail 12, second rail 14 and signal system controller are similar to the system disclosed in FIG. 2. The signal system controller 18, however, further includes a pair of insulated joint test circuits operable to apply a test signal across each of the insulated joints 26, 36. In various embodiments, the test signal includes one or inure of an AC voltage signal, a DC voltage signal, and a DC coded pulse signal similar to the DC coded pulse signals generated by the track code generators 42, 142. In this embodiment, the first insulated joint test circuit 60 has a test signal transmitter 62, a test signal receiver 64, and a test signal switch 66, all of which are in series with the insulated joint 26. The first insulated joint test circuit 60 may also include one or more safety resistors 68 as illustrated. Similarly, the second insulated joint test circuit 70 has a test signal transmitter 72, a test signal receiver 74, a test signal switch 76, and one or more optional safety resistors 76 in series with the insulated joint 36. In various embodiments, the test signal transmitter is a voltage source, such as a controllable power supply, and the test signal receiver is a measuring device, such as an ammeter.

The insulated joints 26, 36 may be tested using the test circuits 60, 70. For example, to test the insulated joint 26, the transmit switches 44, 144 and receive switches 50, 150 of the signal system controller are opened, and the first test circuit switch 66 is closed. In this configuration, the insulated joint 26 is electrically connected in series with the test signal transmitter 62 and the test signal receiver 64. The test signal transmitter 62 is then controlled to apply a voltage signal across the insulated joint 26, while the test signal receiver 64 measures the leakage current flowing through the circuit. In a similar manner, insulated joint 36 may be tested by opening transmit switches 44, 144 and receive switches 50, 150, while closing second test circuit switch 76. Because the first test circuit 60 and the second test circuit 70 are independent, the insulated joints 26, 36 may be tested at the same time.

During a test of either insulated joint, the measured leakage current may be zero, indicating an ideal insulating joint that completely isolates the track sections 22, 24 or track sections 32, 34. As the measured leakage current increases, the integrity of the insulated joint may be assessed by comparing the measure leakage current to one or more thresholds as previously discussed. For example, a threshold may be defined that identifies a failed insulating joint requiring the track system to be shut down until repairs may be completed. More preferably, one or more thresholds may be established indicating that the insulated joint has degraded, but remains usable, allowing repairs to be proactively scheduled. The urgency of scheduling a repair may thus be determined by the extent of the leakage current through the insulated joint. In other embodiments, the integrity of the insulated joint may be assessed based on a trend or rate of change of a leakage current. By identifying changes in the measured leakage current, changes in the integrity of the insulated joint may be identified and evaluated for potential action, such as preventative maintenance.

Figure 4:
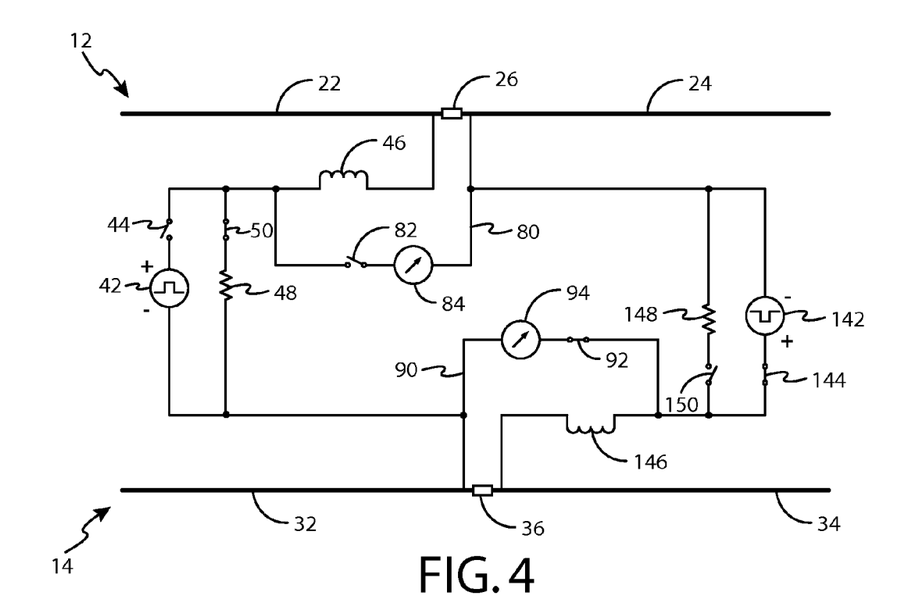
FIG. 4 is a schematic view of another embodiment of a signal system controller configured to test an insulated joint in the first rail.
Figure 5:
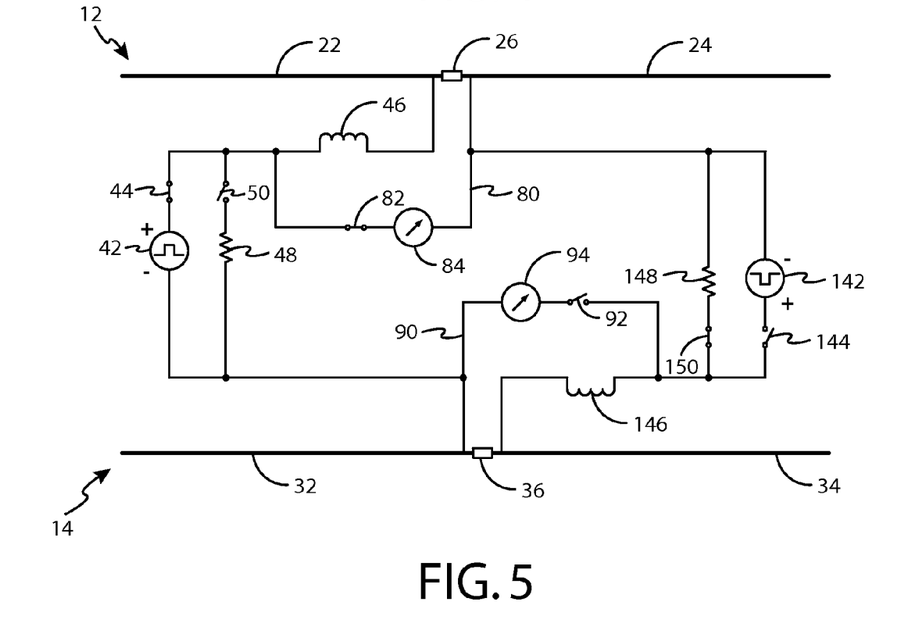
FIG. 5 is a schematic view of another embodiment of a signal system controller configured to test an insulated joint in the second rail.

Referring now to FIGS. 4 and 5, another embodiment of a system for testing insulated joints is disclosed. The system uses the transmitter and receiver capability of the signal system controller to test the insulated joints, avoiding the need for a separate test signal transmitter. As shown in FIG. 4, the system includes a pair of insulated joint bypass circuits 80, 90 that facilitate testing of the insulated joints. The insulated joint bypass circuits 80, 90 each include a bypass switch 82, 92. In the illustrated embodiment, the insulated joint bypass circuits 80, 90 also each include a bypass receiver 84, 94. The bypass receivers 84, 94 are configured to measure current flow through the circuit in a similar manner as the test signal receiver discussed above.

Referring to FIG. 4, the signal system controller is shown configured to test the insulated joint 26 in the first rail 12 using the second bypass circuit 90. A circuit is formed through the insulated joint 26 by closing transmit switch 144, second bypass switch 92 and receive switch 50, while opening transmit switch 44, first bypass switch 82, and receive switch 150. In this configuration, the insulated joint 26 is electrically connected in series with the track code generator 142 and the second bypass meter 94. The track code generator 142 is then controlled to apply a voltage signal across the insulated joint 26. The applied voltage signal may be the DC coded pulse signal used for communicating along the rails, or may be a separate AC or DC signal for testing the insulated joint 26. While the voltage signal is being applied to the insulated joint 26, the second bypass meter 94 measures the leakage current flowing through the circuit. In another embodiment, the receive sense resistor 48 is used to measure the leakage current flowing through the circuit instead of or in addition to, the bypass meter 94. Once the leakage current is measured, the integrity of the insulated joint 26 may be determined and actions based upon the extent of any degradation or failure of the insulated joint. In another embodiment, insulated joint 26 may be tested using track code generator 42 by closing transmit switch 44, receive switch 150, and second bypass switch 92.

Referring to FIG. 5, the signal system controller is shown configured to test the insulated joint 36 in the second rail 14 using the first bypass circuit 80. A circuit is formed through the insulated joint 36 by closing transmit switch 44, first bypass switch 82 and receive switch 150, while opening transmit switch 144, second bypass switch 92, and receive switch 50. In this configuration, the insulated joint 36 is electrically connected in series with the track code generator 42 and the first bypass meter 84. The track code generator 42 is then controlled to apply a voltage signal across the insulated joint 36, and the leakage current through the insulated joint is measure with one or more of the bypass meter 84 or the receive sense resistor 148. The integrity of the insulated joint 36 in the second rail 14 may then be determined based upon the measured leakage current. In another embodiment, insulated joint 36 may be tested using track code generator 142 by closing transmit switch 144, receive switch 50, and first bypass switch 82.

In each of the foregoing embodiments, the measured leakage current may be used to determine the resistance of the insulated joint being tested and the determined resistance. The resistance of the insulated joint may be used in the same manner as the leakage current to assess the integrity of the insulated joint, such as through comparison to one or more thresholds corresponding to the degree of degradation or failure of the insulated joint.

In each of the previously discussed embodiments, the system may also include a communications interface 200 and/or controller 202, which may communicate with a remote operator 204 (as shown in FIG. 1). The communication interface 200 in various embodiments provides both local and remote control over the signal system controller and insulated joint testing circuit. In some embodiments, the system also includes a controller 202 in communication with the communication interface 200, and configured to operate the signal system controller to test the insulated joints in response to instructions received from an operator. In other embodiments, the system may include controller 202 without communication interface 200. The communications interface 200 communicates with a remote operator 204, which may be an automated track testing system as previously discussed. In other embodiments, the remote operator 204 is a user controlling the system by communicating instructions to the system over communications interface 200, which, through the controller 202, results in operation of the signal system controller to test the insulated joints by selectively applying a voltage across the insulated joints and measuring the resulting leakage current.

In yet another embodiment, the controller 202 is configured to conduct tests of the insulated joints in-between communications along the rails. As discussed above, the signal system controllers communicate with DC coded pulses in frames of 2.8 seconds, where the coded pulses reside in the first 1.4 seconds of the frame. In one embodiment, during the second half of the frame, the controller 202 may conduct a test of the insulated joints without disrupting the normal operation of the signal system controllers synchronizing communications along the rails.

In various embodiments, the disclosed system may communicate a maintenance request to a remote operator in response to determining the integrity of an insulated joint. Due to the automated and real-time monitoring capabilities, maintenance requests may be generated and/or the health status of the insulated joint reported without the need for user intervention. In some embodiments, maintenance or supervisory personnel are notified by an audio alarm, a visual alarm, a text message, an email, an instant message, a phone call, or other method appropriate for the operating environment.

In another embodiment, an insulated joint test module is disclosed that is configured to be connected to a signal system controller. The insulated joint test module may be provided as an add-on or upgrade to an existing signal system controller. In embodiments, the insulated joint test module includes a controllable test circuit having a test signal transmitter and a test signal receiver, and be configured to connect to a signal system controller such that the controllable test circuit spans an insulated joint. In an embodiment, the controllable test circuit is test circuit 60 or test circuit 70 as illustrated in FIG. 3. In an embodiment, the insulated joint test module connects to track wires extending from the signal system controller to the rails on either side of an insulated joint. The connection to the track wires may be provided near the rails, or in a signal room as desired. The insulated joint test circuit is also configured to receive an input from a controller to test an insulated joint. For example, in response to the input for the controller, the insulated test circuit closes a switch (such as switch 66) to connect the circuit, applies a test signal across the insulated joint with the test signal transmitter (such as test signal transmitter 62) and measures leakage current through the insulated joint with the test signal receiver (such as test signal receiver 64). The insulated joint test module is further configured to generate an output signal responsive to the measure leakage current. In embodiments, the output signal corresponds to the measured leakage current, or to a health status of the insulated joint determined from the measured leakage current. Alternatively, the output signal may correspond to a health status of the insulated joint determined from a measured trend in the measured leakage current over a series of measurements. The output signal from the insulated joint test module may be communicated to a controller, communications interface and/or remote controller. In this manner, existing signal system controllers may be upgraded to enable remote monitoring and testing, to achieve similar improvements in maintenance cost reductions.

Embodiments of the presently disclosed systems and methods provide for remote testing insulating joints, including automated and real-time testing, in ways not possible with prior systems resulting in improved reliability and reduced operating costs for railroad owners and operators.

In the specification and claims, reference will be made to a number of terms that have the following meanings. The singular forms "a", "an" and "the" include plural referents unless the context clearly dictates otherwise. Approximating language, as used herein throughout the specification and claims, may be applied to modify any quantitative representation that could permissibly vary without resulting in a change in the basic function to which it is related. Accordingly, a value modified by a term such as "about" is not to be limited to the precise value specified. In some instances, the approximating language may correspond to the precision of an instrument for measuring the value. Similarly, "free" may be used in combination with a term, and may include an insubstantial number, or trace amounts, while still being considered free of the modified term. Moreover, unless specifically stated otherwise, any use of the terms "first," "second," etc., do not denote any order or importance, but rather the terms "first," "second," etc., are used to distinguish one element from another.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable, or suitable. For example, in some circumstances an event or capacity can be expected, while in other circumstances the event or capacity cannot occur—this distinction is captured by the terms "may" and "may be." The term "instructions" as used herein may refer to computer executable instructions.

This written description uses examples to disclose the invention, including the best mode, and also to enable one of ordinary skill in the art to practice the invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not different from the literal language of the claims, or if they include equivalent structural elements with insubstantial differences from the literal language of the claims.

The invention claimed is:

1. A system comprising:
 a signal system controller configured to be electrically connected to a first track section of a first rail of a track system, and to be electrically connected to a second track section of the first rail, wherein the first track section is separated from the second track section by a first rail insulated joint,
 wherein the signal system controller is configured to transmit a test signal on the first track section and configured to receive the test signal on the second track section to test the first rail insulated joint between the first track section and the second track section,
 wherein the signal system controller is further configured to be electrically connected to a third track section of a second rail of the track system, and to be electrically connected to a fourth track section of the second rail, wherein the third track section is separated from the fourth track section by a second rail insulated joint,
 wherein the signal system controller is configured to transmit the test signal on the third track section and configured to receive the test signal on the fourth track section to test the second rail insulated joint between the third track section and fourth track section, and
 wherein the signal system controller comprises a first insulated joint bypass circuit configured to selectively connect a first transmitter to a second receiver bypassing the first insulated joint.

2. The system of claim 1, wherein the signal system controller comprises a first joint test circuit having a first test signal transmitter and a first test signal receiver connected in series across the first rail insulated joint.

3. The system of claim 1, wherein the signal system controller comprises a second joint test circuit having a second test signal transmitter and a second lest signal receiver connected in series across the second rail insulated joint.

4. The system of claim 1, wherein the signal system controller comprises a second insulated joint bypass configured to selectively connect a second transmitter to a first receiver bypassing the second insulated joint.

5. The system of claim 1, further comprising a test controller configured to operate the signal system controller to test the first insulated joint in response to instructions received from an operator.

6. The system of claim 1, wherein the signal system controller is configured to automatically transmit the test signal during a time period the signal system controller is not transmitting a control signal on the first track section.

7. The system of claim 1, wherein the test signal is a control signal used to communicate from the signal system controller to another signal system in the track system.

8. The system of claim 1, wherein the signal system controller is configured to add the test signal to a control signal used to communicate from the signal system controller to another signal system in the track system.

9. The system of claim 1, further comprising a communications interface operable to receive instructions from a remote operator and to control the signal system controller to test the first insulated joint in response to the instructions that are received.

10. The system of claim 1, wherein the signal system controller is further configured to determine at least one of an electrical resistance of the first insulated joint or a leakage current through the first insulated joint.

11. A test module comprising:
a controllable test circuit having a test signal transmitter and a test signal receiver, wherein the insulated joint test module is configured to connect to a signal system controller such that the controllable test circuit spans an insulated joint,
wherein the test signal transmitter is configured to apply a test signal across the insulated joint responsive to an input from at least one of the signal system controller or a second controller,
wherein the test signal receiver is configured to measure a leakage current through the insulated joint,
wherein the insulated joint test module is further configured to generate an output signal responsive to the measured leakage current, and
wherein the controllable test circuit further includes a switch controllable in response to the input from the at least one of the signal system controller or the second controller, and wherein the switch is configured to selectively close the test circuit spanning the insulated joint to enable testing of the insulated joint.

12. The insulated joint test module of claim 11, wherein the output signal corresponds to a health status of the insulated joint.

13. The insulated joint test module of claim 11, wherein the insulated joint test module is further configured to communicate the output signal to the at least one of the signal system controller or the second controller.

* * * * *